(12) United States Patent
Xu et al.

(10) Patent No.: US 12,477,900 B2
(45) Date of Patent: Nov. 18, 2025

(54) MASK PLATE, DISPLAY SUBSTRATE AND MANUFACTURING METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhe Xu, Beijing (CN); Wenxuan Zhang, Beijing (CN); Fei You, Beijing (CN); Fei Liao, Beijing (CN); Ce Li, Beijing (CN); Long Jiang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 442 days.

(21) Appl. No.: 17/640,023

(22) PCT Filed: Mar. 10, 2021

(86) PCT No.: PCT/CN2021/079863
§ 371 (c)(1),
(2) Date: Mar. 3, 2022

(87) PCT Pub. No.: WO2021/218413
PCT Pub. Date: Nov. 4, 2021

(65) Prior Publication Data
US 2022/0320206 A1    Oct. 6, 2022

(30) Foreign Application Priority Data
Apr. 30, 2020 (CN) .......................... 202010362776.3

(51) Int. Cl.
*H10K 59/122* (2023.01)
*C23C 14/04* (2006.01)
*G03F 1/26* (2012.01)
*H10K 59/12* (2023.01)
*H10K 71/00* (2023.01)

(52) U.S. Cl.
CPC ......... *H10K 59/122* (2023.02); *C23C 14/042* (2013.01); *G03F 1/26* (2013.01); *H10K 59/1201* (2023.02); *H10K 71/00* (2023.02)

(58) Field of Classification Search
CPC .. H10K 59/122; H10K 71/00; H10K 59/1201; G03F 1/26; G03F 1/00
See application file for complete search history.

(56) References Cited

U.S. PATENT DOCUMENTS 5,725,972 A * 3/1998 Takeshita .................. G03F 1/50
430/324
2006/0199114 A1    9/2006 Sekiya et al.
(Continued)

FOREIGN PATENT DOCUMENTS

CN    104423084 A    3/2015
CN    104714363 A    6/2015
(Continued)

OTHER PUBLICATIONS

Smith et al., "Design, simulation, and fabrication of three-dimensional microsystem components using grayscale photolithography," Journal of Micro/Nanolithography, MEMS, and MOEMS, 2019 (Year: 2019).*

(Continued)

*Primary Examiner* — Steven B Gauthier
*Assistant Examiner* — Alvin L Lee
(74) *Attorney, Agent, or Firm* — IPro, PLLC

(57) ABSTRACT

A mask plate is used for manufacturing a pixel definition layer of the display substrate, which includes first transparent patterns and first opaque patterns, and further includes (Continued)

transition structures located between the first transparent patterns and the first opaque patterns. And the transition structures include a plurality of second transparent patterns and second opaque patterns alternately arranged, and a line width of each of the second transparent patterns and each of the second opaque patterns is less than the resolution of an exposure machine by using the mask plate for exposure.

15 Claims, 6 Drawing Sheets

(56) References Cited

U.S. PATENT DOCUMENTS

2019/0035866 A1    1/2019  Mo et al.
2020/0176702 A1*   6/2020  Hou ..................... H10K 50/82
2020/0264504 A1*   8/2020  Wu ............................ G03F 1/54
2021/0408490 A1*  12/2021  Zhang ...................... G03F 1/54

FOREIGN PATENT DOCUMENTS

| CN | 105511221 A | * | 4/2016 | ............... G03F 1/68 |
| CN | 206133181 U | | 4/2017 | |
| CN | 107340683 A | | 11/2017 | |
| CN | 108761999 A | | 11/2018 | |
| CN | 108986676 A | | 12/2018 | |
| CN | 109136834 A | | 1/2019 | |
| CN | 111443565 A | | 7/2020 | |
| WO | WO-2019127872 A1 | * | 7/2019 | ....... G02F 1/133345 |

OTHER PUBLICATIONS

PCT/CN2021/079863 international search report and written opinion.

* cited by examiner

MASK PLATE, DISPLAY SUBSTRATE AND MANUFACTURING METHOD THEREOF, AND DISPLAY DEVICE

TECHNICAL FIELD

The present disclosure relates to the technical field of displays, and particularly relates to a mask plate, a display substrate, a manufacturing method thereof, and a display device.

BACKGROUND

In the related art, when manufacturing a pixel definition layer of a display substrate, a layer of photosensitive pixel definition layer material is formed on the substrate, the pixel definition layer material is exposed by using a mask plate, and a pattern of the pixel definition layer is formed after development. However, the slope angle of the pattern of the pixel definition layer in the related art is relatively large, a color deviation is easily formed, and an encapsulation layer is subsequently formed; and when an organic rheological material is printed on the display substrate, the organic rheological material is not easy to realize plane flow, which reduces the encapsulation reliability and thus reduces the yield of the display device.

SUMMARY

The technical problem to be solved by the present disclosure is to provide a mask plate, a display substrate, a manufacturing method thereof, and a display device, which can improve the yield of the display device.

In order to solve the above-mentioned technical problem, the embodiments of the present disclosure provide the following technical solutions:

In one aspect, a mask plate is provided for manufacturing a pixel definition layer of the display substrate, which includes a first transparent pattern and a first opaque pattern, and further includes transition structures located between the first transparent pattern and the first opaque pattern, wherein the transition structures include a plurality of second transparent patterns and second opaque patterns alternately arranged, and a line width of each of the second transparent patterns and each of the second opaque patterns is less than the resolution of an exposure machine by using the mask plate for exposure.

In an optional embodiment of the present disclosure, the first opaque pattern has the same shape as an upper surface of the pixel definition layer, the first transparent pattern has the same shape as a pixel opening region defined by the pixel definition layer, and the transition structures have the same shape as an orthographic projection of a side surface of the pixel definition layer on the display substrate.

In an optional embodiment of the present disclosure, the first transparent pattern has the same shape as an upper surface of the pixel definition layer, the first transparent pattern has the same shape as the pixel opening region defined by the pixel definition layer, and the transition structures have the same shape as the orthographic projection of the side surface of the pixel definition layer on the display substrate.

In an optional embodiment of the present disclosure, both the second transparent patterns and the second opaque patterns are annular, and the center of the second transparent patterns coincides with the center of the second opaque patterns.

In an optional embodiment of the present disclosure, the first opaque pattern surrounds the first transparent pattern, and the transition structures between part of the edges and the first opaque pattern in the plurality of edges of the first transparent pattern are the opaque pattern or the transparent pattern.

In an optional embodiment of the present disclosure, the first opaque pattern surrounds the first transparent pattern, the first transparent pattern has a rectangular shape and includes a first edge, a second edge, a third edge, and a fourth edge which are connected end to end in sequence, wherein the transition structures between the second edge and the fourth edge and the first opaque pattern are the opaque pattern or the transparent pattern.

In an optional embodiment of the present disclosure, the transition structures include a first transition structure and a second transition structure, the first transparent pattern surrounds the first opaque pattern, the first opaque pattern has the rectangular shape, and includes a first edge, a second edge, a third edge, and a fourth edge which are successively connected end-to-end in sequence, wherein the first transition structures are respectively arranged between the first edge and the third edge and the first transparent pattern, and the second transition structures are respectively arranged between the second edge and the fourth edge and the first transparent pattern. The first transition structure and the second transition structure satisfy any of the following:

the number of the second transparent patterns included in the first transition structures is different from the number of the second transparent patterns included in the second transition structures;

the number of the second opaque patterns included in the first transition structures is different from the number of the second opaque patterns included in the second transition structures;

the line width of the second transparent patterns included in the first transition structures is different from the line width of the second transparent patterns included in the second transition structures; and the line width of the second opaque patterns included in the first transition structures is different from the line width of the second opaque patterns included in the second transition structures.

In an optional embodiment of the present disclosure, the line width of the second transparent pattern gradually increases from the first opaque patterns to the first transparent patterns.

In an optional embodiment of the present disclosure, the transition structures include a number of three to five second transparent patterns and a number of three to five second opaque patterns.

In an optional embodiment of the present disclosure, the second transparent patterns and the second opaque patterns all have the line width of less than 2.5 μm.

The embodiments of the present disclosure also provide a method for manufacturing the display substrate, which includes:

forming a photosensitive pixel definition layer material layer on the driving substrate, exposing a material layer of the pixel definition layer by using the mask plate as described above, and forming the pattern of the pixel definition layer after developing.

The embodiments of the present disclosure also provide the display substrate, wherein the pixel definition layer of the display substrate is obtained by patterning the material layer of the pixel definition layer by using the mask plate as described above.

In an optional embodiment of the present disclosure, the slope angle of the pattern of the pixel definition layer is less than 20°.

In an optional embodiment of the present disclosure, the pixel definition layer of the display substrate defines a pixel opening region that exposes at least two anode patterns whose orthogonal projections on the display substrate do not overlap.

In an optional embodiment of the present disclosure, the pixel opening region has a rectangular shape, and the pattern of the pixel definition layer includes a first side surface, a second side surface, a third side surface, and a fourth side surface surrounding the pixel opening region and are successively connected end-to-end in sequence, wherein the first side surface have the same slope angle as the third side surface, the second side surface have the same slope angle as the fourth side surface, and the first side surface have a greater slope angle than the second side surface.

In an optional embodiment of the present disclosure, the pixel opening region has the same shape as the first transparent patterns; or The shape of the pixel opening region is the same as the shape defined by the contours of the transition structures.

The embodiments of the present disclosure also provide the display device including the display substrate as described above.

The embodiments of the present disclosure have the following beneficial effects:

in the above-mentioned solution, the mask plate includes the first transparent patterns and the first opaque patterns, the transition structures are arranged between the first transparent patterns and the first opaque patterns, the transition structures include the plurality of second transparent patterns and second opaque patterns which are arranged alternately, and a line width of each of the second transparent patterns and each of the second opaque patterns is less than the resolution of an exposure machine which uses the mask plate to perform exposure. As a result, when preparing the pattern of the pixel definition layer and using the mask plate to perform exposure on the material layer of the pixel definition layer, when exposure light passes through the transition structure, the pattern of the transition structures cannot be resolved effectively. After the light passes through the transition structures, the light becomes a blurred form; only a part of the light can pass through the transition structures and irradiate onto the material layer of the pixel definition layer, and a transition can be formed between the first transparent patterns and the first opaque patterns. In this way, after developing the material layer of the pixel definition layer, a delicate transition is formed at the interface between a removed region of the material layer of the pixel definition layer and a remaining region of the material layer of the pixel definition layer, so that the side surface of the formed pattern of the pixel definition layer has a delicate slope, the slope angle of the pattern of the pixel definition layer can be reduced, and a color deviation is not easily formed, and an encapsulation layer is subsequently formed; and when the organic rheological material is printed on the display substrate, it is easy for the organic rheological material to realize plane flow, and the reliability of encapsulation can be ensured, thereby improving the yield of the display device.

DESCRIPTION OF NUMBERS IN THE ACCOMPANY DRAWINGS

Figure 1:
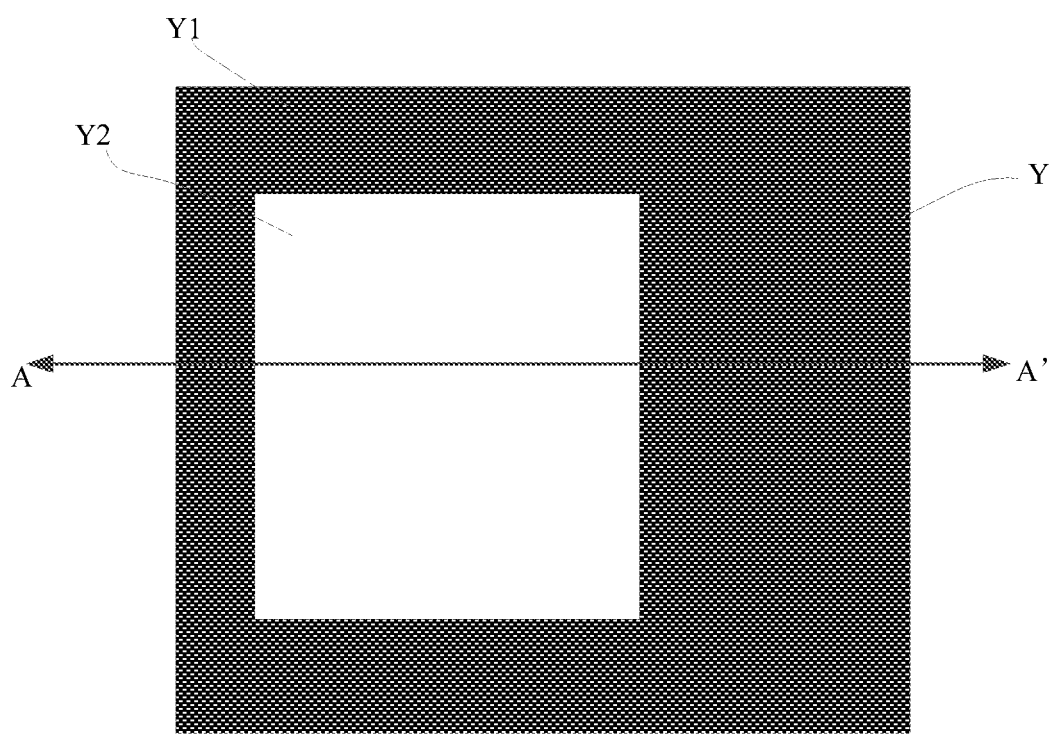
FIG. 1 is a schematic diagram of a prior mask plate.

1 Base substrate
2 Buffer layer
3 Gate insulating layer
4 Interlayer insulating layer
5 Passivation layer and planarization layer
61 Material layer of pixel definition layer
6 Pixel definition layer
7 Active layer
8 Gate electrode
9 Source electrode
10 Drain electrode
11 Anode plate
Y Mask plate in related art
Y1 Opaque patterns
Y2 Transparent patterns
M Masking plate of embodiments of the present disclosure
M1 First opaque patterns
M2 First transparent patterns
M3 Transition structures
M31 Second opaque patterns
M32 Second transparent patterns
B1 First edge
B2 Second edge
B3 Third edge
B4 Fourth edge

DETAILED DESCRIPTION

In order to make the technical problems, technical solutions, and advantages of the present disclosure clearer, a detailed description will be given below with reference to the accompanying drawings and specific embodiments.

Figure 2:
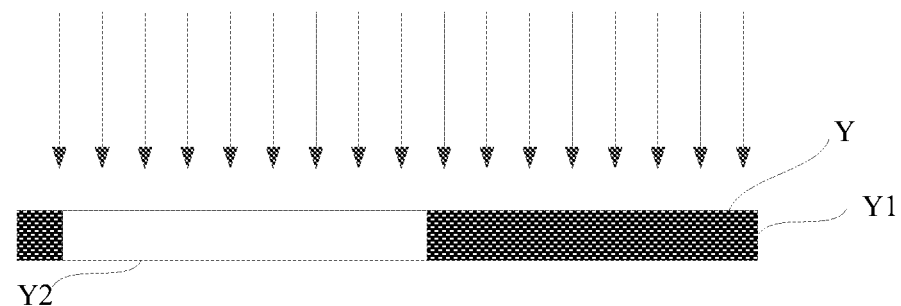
FIG. 2 is a schematic diagram of exposure of a material layer of a pixel definition layer by using the mask plate shown in FIG. 1.
Figure 2:
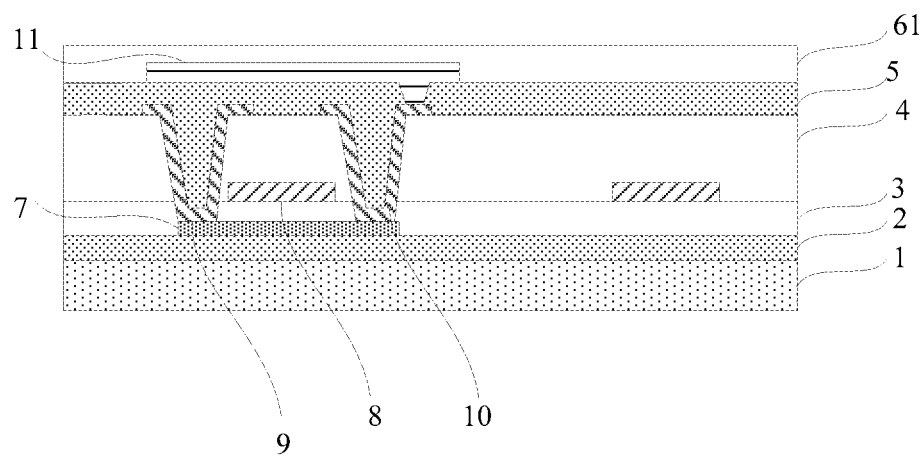
Figure 3:
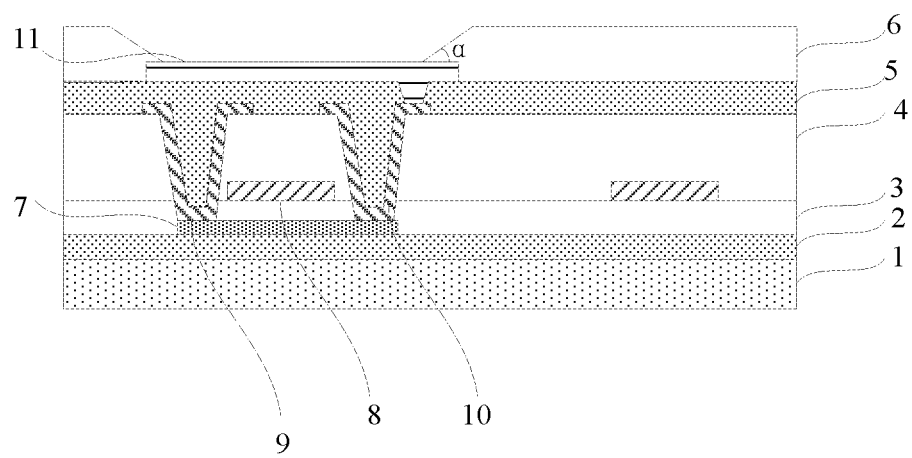
FIG. 3 is a schematic diagram of a pixel definition layer pattern in the related art.

FIG. 1 is the schematic diagram of a conventional mask plate. As shown in FIG. 1, the conventional mask plate Y used for manufacturing the pixel definition layer includes the opaque pattern Y1 and the transparent pattern Y2, wherein the opaque pattern Y1 corresponds to the pattern of the pixel definition layer to be formed. FIG. 2 is a schematic diagram for exposing the material layer of the pixel definition layer by using the mask plate shown in FIG. 1, wherein the mask plate shown in FIG. 2 is the schematic cross-sectional view of the mask plate shown in FIG. 1 in the direction AA'. FIG. 3 is a schematic diagram of the pixel definition layer pattern formed after developing the pixel definition layer material layer. As shown in FIG. 3, the slope angle of the pixel definition layer pattern is α, and the value of a is generally relatively large, reaching above 30°, such as 34.8°. And an organic light-emitting layer of the display substrate is a continuous film layer covering the whole layer of the pixel definition layer pattern; if the slope angle of the pixel definition layer pattern is too large, the light output efficiency of the organic light-emitting layer will be affected, which will easily cause a large apparent angular deviation. And the encapsulation layer is subsequently formed, and when the organic rheological material is printed on the display substrate, the organic rheological material is not easy to realize plane flow. The package reliability is reduced, which in turn reduces the yield of the display device.

The embodiments of the present disclosure provide the mask plate, the display substrate, the manufacturing method thereof, and the display device, which can improve the yield of the display device.

Figure 4:
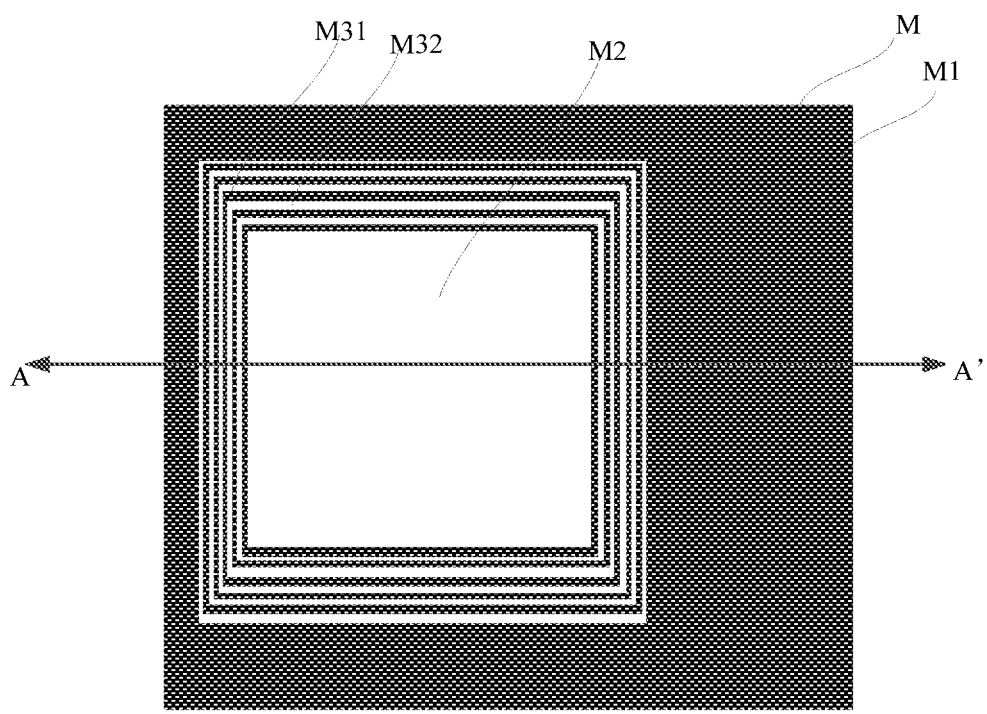
FIG. 4 is a schematic diagram of a mask plate according to an embodiment of the present disclosure.
Figure 5:
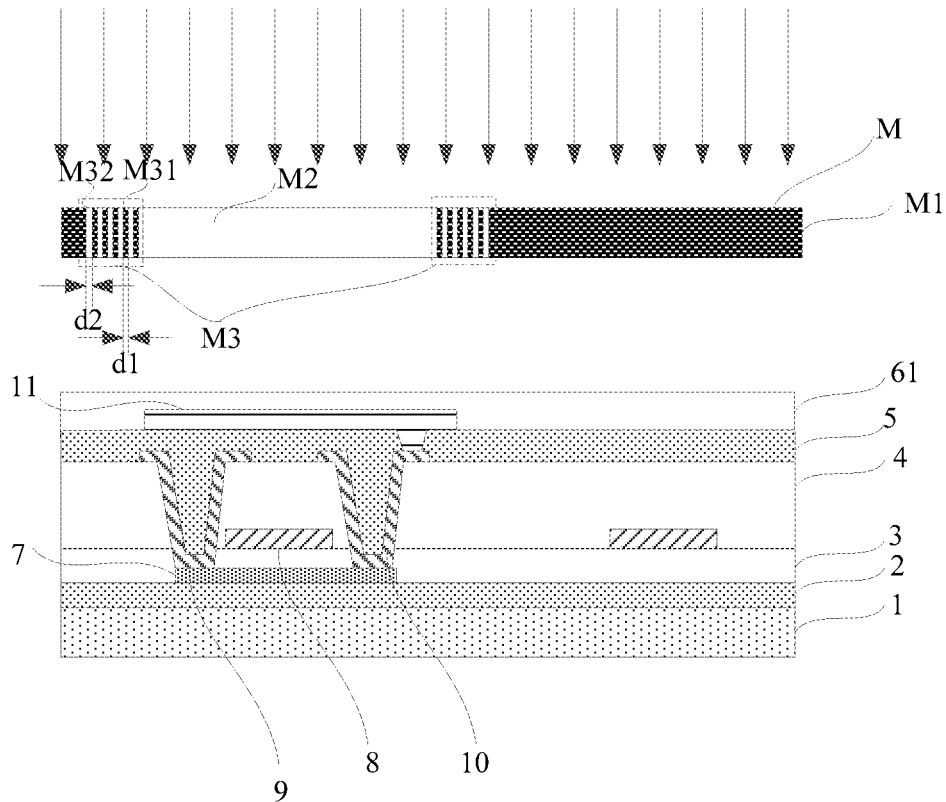
FIG. 5 is a schematic diagram for exposing a pixel definition layer material layer by using the mask plate shown in FIG. 4 according to an embodiment of the present disclosure.

The embodiment of the present disclosure provides the mask plate for manufacturing the pixel definition layer of the display substrate. FIG. 4 is a schematic diagram of the mask plate of the embodiment of the present disclosure. The mask plate shown in FIG. 5 is a schematic cross-sectional diagram of the mask plate shown in FIG. 4 in the direction AA'. as shown in FIGS. 4 and 5, the mask plate M of the present embodiment includes the first transparent patterns M2 and the first opaque patterns M1, and further includes the transition structures M3 located between the first transparent patterns M2 and the first opaque patterns M1; the transition structures M3 includes a plurality of second transparent patterns M32 and second opaque patterns M31 which are alternatively arranged, wherein the line width d2 of each of the second transparent patterns M32 is less than the resolution of the exposure machine using the mask plate for exposure, and the line width d1 of each of the second opaque patterns M31 is also less than the resolution of the exposure machine using the mask plate for exposure.

In the present embodiment, the mask plate includes the first transparent patterns and the first opaque patterns, the transition structures are arranged between the first transparent patterns and the first opaque patterns, the transition structures include the plurality of second transparent patterns and second opaque patterns which are arranged alternately, and a line width of each of the second transparent patterns and each of the second opaque patterns is less than the resolution of the exposure machine which uses the mask plate to perform exposure. As such, when preparing the pattern of the pixel definition layer and using the mask plate to perform exposure on the material layer of the pixel definition layer, when exposure light passes through the transition structures, the pattern of the transition structures cannot be resolved effectively. After the light passes through the transition structures, the light becomes a blurred form; only a part of the light can pass through the transition structures and irradiate onto the material layer of the pixel definition layer, and a transition can be formed between the first transparent patterns and the first opaque patterns; in this way, after developing the material layer of the pixel definition layer, a delicate transition is formed at the interface between a removed region of the material layer of the pixel definition layer and a remaining region of the material layer of the pixel definition layer, so that the side surface of the formed pattern of the pixel definition layer has a delicate slope, the slope angle of the pattern of the pixel definition layer can be reduced, and a color deviation is not easily formed, and the encapsulation layer is subsequently formed; and when the organic rheological material is printed on the display substrate, it is easy for the organic rheological material to realize plane flow, and the reliability of encapsulation can be ensured, thereby improving the yield of the display device.

Compared with reducing the slope angle of the pixel definition layer using soft baking, curing, and other process means, using the mask plate of the present embodiment to prepare the pixel definition layer can reduce the process time for preparing the pixel definition layer, which is conducive to mass production and use. In addition, the technical solution of the present embodiment can greatly reduce the production cost of the mask plate, compared to providing a semi-permeable film between the first transparent patterns M2 and the first opaque patterns M1 to reduce the slope angle of the pixel definition layer.

Taking exposure using the mask plate on the exposure machine with a resolution of 2.5 μm as an example, the line width d1 of the first transparent patterns M2 and the line width d2 of the first opaque patterns M1 in the present embodiment are both less than 2.5 μm. As such, when a light ray passes through the pattern region of the transition structures M3, the pattern of the transition structures M3 cannot be effectively resolved. Thereafter the light ray passes through the pattern region of the transition structures M3, the pattern becomes the blurred form, achieving the effect of partially transmitting light, and only a part of the light ray can pass through the transition structures M3 to irradiate onto the material layer of the pixel definition layer. As a result, it is possible to form the transition between the first transparent patterns M2 and the first opaque patterns M1, so that after developing the material layer of the pixel definition layer, the delicate transition is formed at the interface between the removal region of the material layer of the pixel definition layer and the remaining region of the material layer of the pixel definition layer, so that the side surface of the formed pattern of the pixel definition layer has the delicate slope, and it is possible to reduce the slope angle of the pattern of the pixel definition layer, and the slope angle of the pixel definition layer made using the mask plate of the present embodiment may be less than 20°, for example, 14.9°.

In the present embodiment, a line width of each of the second transparent patterns and each of the second opaque patterns of the mask plate is determined by the resolution of the exposure machine using the mask plate for exposure. The resolution of different exposure machines is different, and a line width of each of the second transparent patterns and each of the second opaque patterns of the mask plate needs to be smaller than the resolution of the exposure machine using the mask plate for exposure.

In some embodiments, if the material layer of the photosensitive pixel definition layer uses a positive photoresist material, the first opaque patterns M1 correspond to the upper surface of the pixel definition layer, the first transparent patterns M2 correspond to the pixel opening region defined by the pixel definition layer, and the transition structures M3 correspond to the side surface of the pixel definition layer. The first opaque patterns M1 have the same shape as the upper surface of the pixel definition layer, and the first transparent patterns M2 have the same shape as the pixel opening region defined by the pixel definition layer. And the shape of the transition structures M3 is the same as the shape of the orthographic projection of the side surface of the pixel definition layer on the display substrate.

In some embodiments of the present disclosure, as shown in FIG. 4, the second transparent patterns M32 and the second opaque patterns M31 may both be annular, and the center of the second transparent patterns M32 coincides with the center of the second opaque patterns M31. Namely, the transition structures M3 are continuous, and the transition structures M3 surround the first transparent patterns M2, so that the slope angle of all side surfaces of the pixel definition layer can be reduced.

In some embodiments of the present disclosure, the first opaque patterns M1 surround the first transparent patterns M2, and among a plurality of edges of the first opaque patterns M1, the transition structures M3 may be provided between each edge and the first opaque patterns M1, or the transition structures M3 may be provided between part of the edges and the first opaque patterns M1. Namely, the transition structures M3 are discontinuous, so that in the region where the transition structures M3 are provided, the slope angle of the side surface of the corresponding pixel definition layer may be reduced, while in the region where the transition structures M3 are not provided, the slope angles of the side surfaces of the corresponding pixel definition layers may not be changed. Namely, the side surfaces of the pixel definition layer in different regions have different slope angles, so that when the luminescent material ink is ink-jet printed on the display substrate, in the region where the slope angles of the side surfaces of the pixel definition layer is relatively low, the luminescent material ink is relatively easy to realize plane flow, and in the region where the slope angles of the side surface of the pixel definition layer is relatively high, the luminescent material ink is not easy to realize plane flow, so that the plane flow direction of the luminescent material ink can be controlled.

Figure 7:
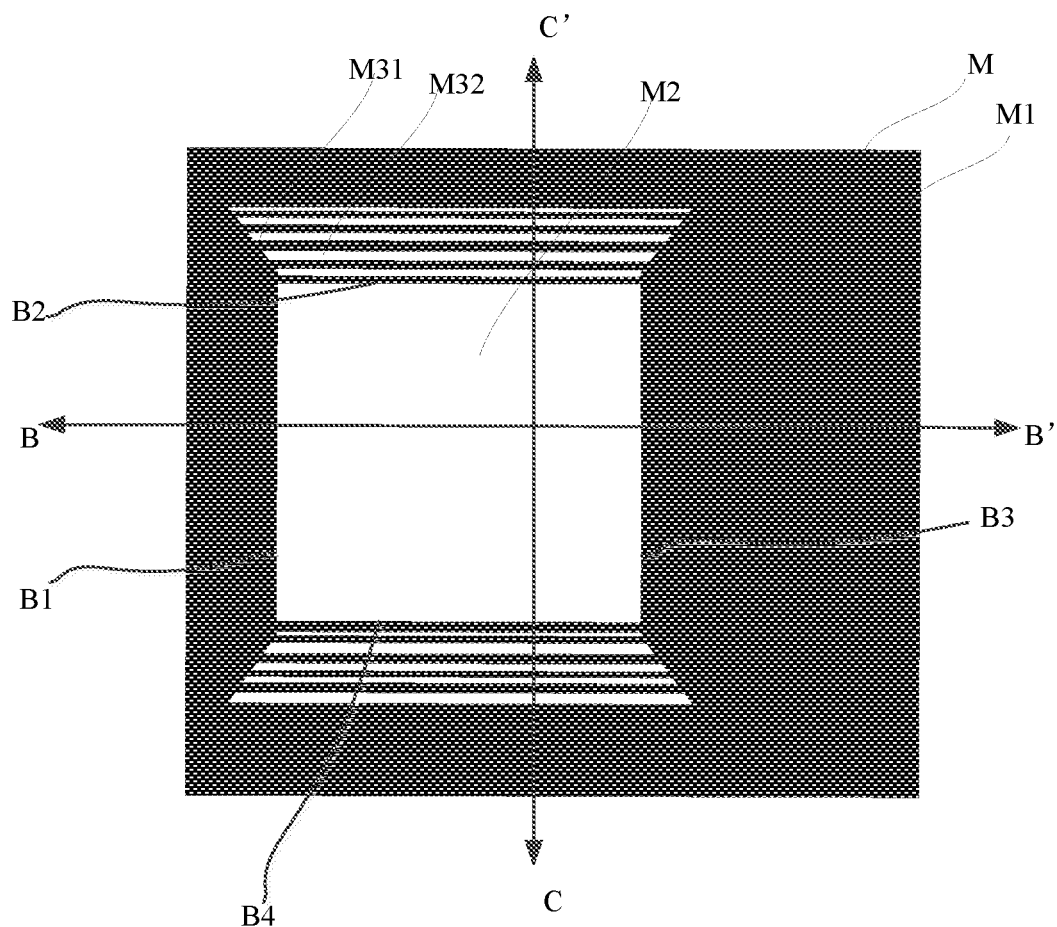
FIG. 7 is a schematic diagram of a mask plate according to another embodiment of the present disclosure.

In a specific example, as shown in FIG. 7, the first opaque patterns M1 surround the first transparent patterns M2, the first transparent patterns M2 are rectangular, and include a first edge B1, a second edge B2, a third edge B3, and a fourth edge B4 which are successively connected end-to-end in sequence, wherein the transition structures M3 between the second edge B2 and the fourth edge B4 and the first opaque patterns M1 are all opaque patterns. The transition structures M3 between the second edge B2 and the fourth edge B4 and the first opaque patterns M1 may also both be transparent patterns.

In this way, after the pixel definition layer of the display substrate is manufactured by using the mask plate M shown in FIG. 7, the side surface of the pixel definition layer extending in the direction perpendicular to the CC' direction has the relatively small slope angle, and the side surface of the pixel definition layer extending in the direction perpendicular to the BB' direction has the relatively large slope angle, so that after the luminescent material ink is ink-jet printed on the display substrate, the luminescent material ink is relatively easy to realize plane flow in the CC' direction.

In some embodiments of the present disclosure, the transition structures include the first transition structures and the second transition structures, the first transparent patterns surround the first opaque patterns, the first opaque patterns have the rectangular shape, and include a first edge, a second edge, a third edge, and a fourth edge which are successively connected end-to-end in sequence, wherein the first transition structures are respectively arranged between the first edge and the third edge and the first transparent patterns, and the second transition structures are respectively arranged between the second edge and the fourth edge and the first transparent patterns. The first transition structures and the second transition structures satisfy any of the following:

the number of the second transparent patterns included in the first transition structures is different from the number of the second transparent patterns included in the second transition structures;

the number of the second opaque patterns included in the first transition structures is different from the number of the second opaque patterns included in the second transition structures;

the line width of the second transparent patterns included in the first transition structures is different from the line width of the second transparent patterns included in the second transition structures; and the line width of the second opaque patterns included in the first transition structures is different from the line width of the second opaque patterns included in the second transition structures.

Specifically the larger the line width of the second transparent patterns is, the more light is transmitted, and the smaller the slope angle is. And, the greater the line width of the second opaque patterns is, the less light is transmitted, and the greater the slope angle is. Further, the larger the number of the second transparent patterns and the second light opaque patterns, the smaller the slope angle.

In this way, by adjusting the line width of the second opaque patterns, the line width of the second transparent patterns, the number of the second opaque patterns, and the number of the second transparent patterns included in the first transition structures and the second transition structures, the slope angle of the side surface of the pixel definition layer corresponding to the transition structures can be adjusted to obtain the pixel definition layer satisfying the requirements.

If the transition structures M3 include an excessive number of the second transparent patterns M32 and the second opaque patterns M31, the cost and structural complexity of the mask plate are increased, and therefore, the transition structures may include a number of three to five second transparent patterns M32 and a number of three to five second opaque patterns M31, which can effectively reduce the slope angle of the patterns of the pixel definition layer without increasing the cost of the mask plate too much.

In some embodiments, the line width of the second transparent patterns M32 and the second opaque patterns M31 increases gradually in the direction from the first opaque patterns M1 to the first transparent patterns M2, so that the transmittance of light passing through the transition structures M3 increases gradually in the direction from the first opaque patterns M1 to the first transparent patterns M2 when exposure is performed using the mask plate M, and the delicate transition can be formed at the interface between the removal region of the material layer of the pixel definition layer and the remaining region of the material layer of the pixel definition layer. The pattern-side surface of the resultant pixel definition layer has the delicate slope.

Figure 8:
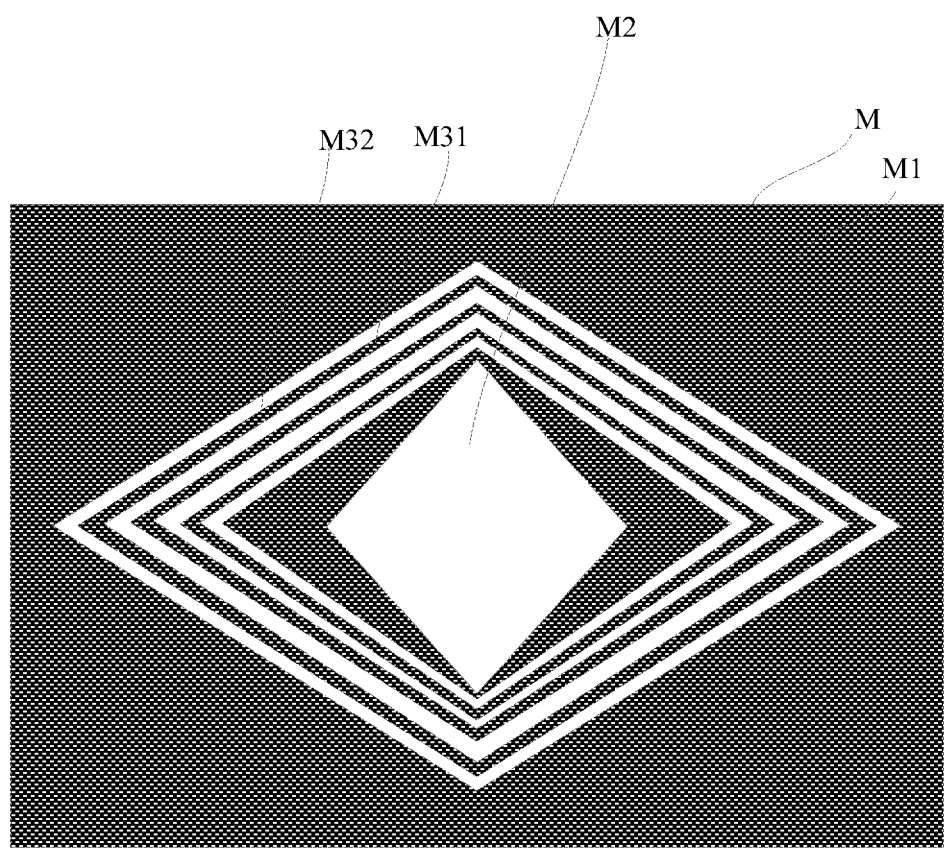
FIG. 8 is a schematic diagram of a mask plate according to yet another embodiment of the present disclosure.
Figure 9:
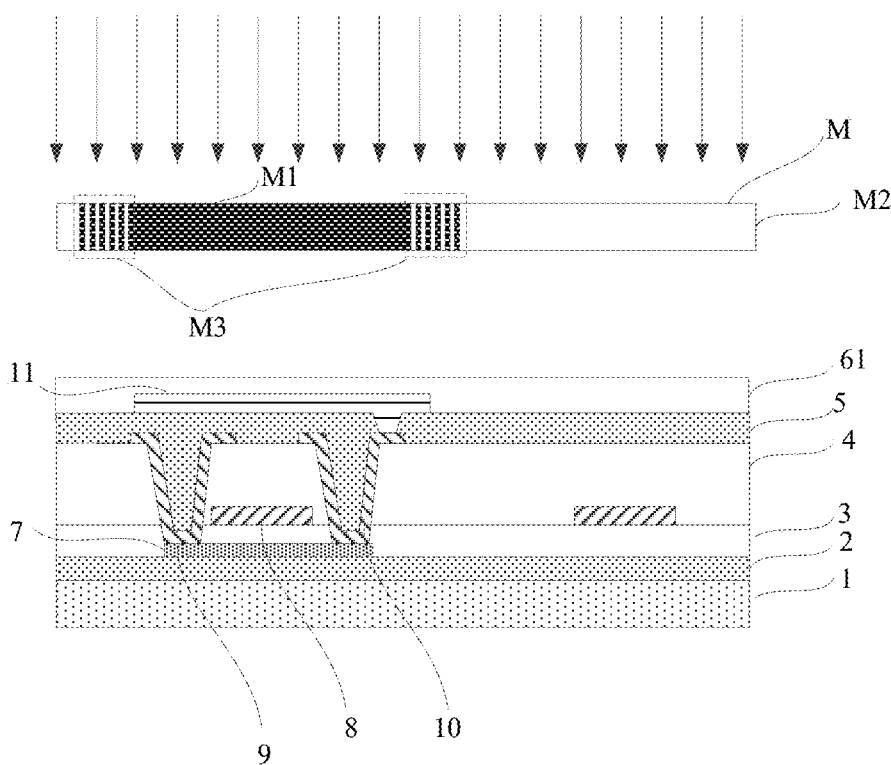

In some embodiments, when the transition structures M3 are annular, the contour shape of the transition structures M3 may be substantially the same as the shape of the first transparent patterns M2. As shown in FIG. 8, the contour shape of the transition structures M3 may also be different from the shape of the first transparent patterns M2.

The above-mentioned embodiment describes that the photosensitive material layer of the pixel definition layer uses the positive photoresist material; certainly, the photosensitive pixel definition layer material layer can also use the negative photoresist material. When the photosensitive material layer of the pixel definition layer uses the negative photoresist material, the first transparent patterns M2 correspond to the upper surface of the pixel definition layer, the first opaque patterns M1 correspond to the pixel opening region defined by the pixel definition layer, and the transition structures M3 correspond to the side surface of the pixel definition layer; and the shape of the first transparent patterns M2 is the same as that of the upper surface of the pixel definition layer. The first opaque patterns M1 are the same as the pixel opening region defined by the pixel definition layer, and the shape of the transition structures M3 is the same as the shape of the orthogonal projection of the side surface of the pixel definition layer on the display substrate.

The embodiments of the present disclosure also provide the method for manufacturing the display substrate, which includes:

forming the photosensitive material layer of the pixel definition layer on the driving substrate, exposing the material layer of the pixel definition layer using the above-mentioned mask plate, and forming the pattern of the pixel definition layer after developing, wherein the slope angle of the pattern of the pixel definition layer is less than 20°.

In the present embodiment, the mask plate includes the first transparent patterns and the first opaque patterns, the transition structures are arranged between the first transparent patterns and the first opaque patterns, the transition structures include the plurality of second transparent patterns and second opaque patterns which are arranged alternately, and a line width of each of the second transparent patterns and each of the second opaque patterns is less than the resolution of the exposure machine which uses the mask plate to perform exposure. Thus, when preparing the pattern of the pixel definition layer and using the mask plate to perform exposure on the material layer of the pixel definition layer, when exposure light passes through the transition structures, the pattern of the transition structures cannot be resolved effectively. After the light passes through the transition structures, the light becomes a blurred form. As such, only a part of the light can pass through the transition structures and irradiate onto the material layer of the pixel definition layer, and a transition can be formed between the first transparent patterns and the first opaque patterns. In this way, after developing the material layer of the pixel definition layer, a delicate transition is formed at the interface between a removed region of the material layer of the pixel definition layer and a remaining region of the material layer of the pixel definition layer, so that the side surface of the formed pattern of the pixel definition layer has a delicate slope, the slope angle of the pattern of the pixel definition layer can be reduced, and a color deviation is not easily formed, and the encapsulation layer is subsequently formed. And when the organic rheological material is printed on the display substrate, it is easy for the organic rheological material to realize plane flow, and the reliability of encapsulation can be ensured, thereby improving the yield of the display device.

In some embodiments, the material layer of the photosensitive pixel definition layer employs the positive photoresist material. Specifically the method includes:

forming the photosensitive material layer of the pixel definition layer on the driving substrate, exposing the material layer of the pixel definition layer by using the above-mentioned mask plate, and forming the pattern of the pixel definition layer after developing, wherein the first opaque patterns M1 of the mask plate corresponds to an upper surface of the pixel definition layer, the first transparent patterns M2 correspond to the pixel opening region defined by the pixel definition layer, and the transition structures M3 correspond to a side surface of the pixel definition layer.

In a specific example, taking a positive and negative photoresist material used by the material layer of the photosensitive pixel definition layer as an example, as shown in FIG. 5, when the pattern of the pixel definition layer is made, the material layer 61 of the photosensitive pixel definition layer is formed on the driving substrate. Specifically the driving substrate includes the base substrate 1, a buffer layer 2 located on the base substrate 1, an active layer 7, a gate insulating layer 3, a gate electrode 8, an interlayer insulating layer 4, a source electrode 9, a drain electrode 10, a passivation layer and a planarization layer 5, and an anode 11, etc. A mask plate M is used to expose the material layer 61 of the pixel definition layer; the first opaque patterns M1 of the mask plate M correspond to an region where the pattern of the pixel definition layer is located; the first transparent patterns M2 of the mask plate M correspond to a pixel region defined by the pattern of the pixel definition layer; the transition structures M3 are arranged between the first opaque patterns M1 and the first transparent patterns M2; the transition structures M3 include the plurality of second transparent patterns M32 and second opaque patterns M31 which are arranged alternately; the line width d2 of the second transparent patterns M32 is less than the resolution of the exposure machine which uses the mask plate M to perform exposure; and the line width d1 of the second opaque patterns M31 is smaller than the resolution of the exposure machine which uses the mask plate M to perform exposure.

Figure 6:
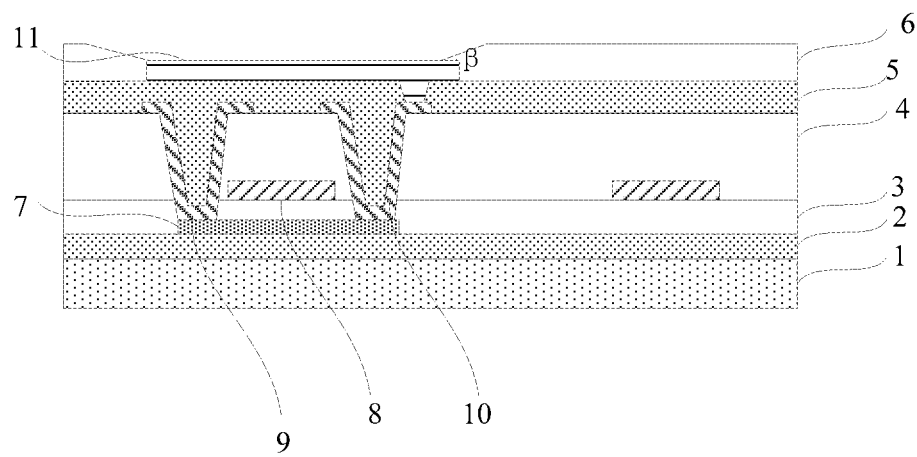
FIG. 6 is a schematic diagram of a pixel definition layer pattern according to an embodiment of the present disclosure.

When the exposure light passes through the transition structures M3, the pattern of the transition structures M3 cannot be effectively obtained; the light passes through the transition structures M3 and becomes a blurred form. Only a part of the exposure light passes through the transition structures M3 and irradiates onto the material layer 61 of the pixel definition layer. In this way, after developing the material layer 61 of the pixel definition layer, the delicate transition is formed at the interface between the removal region of the material layer of the pixel definition layer and the remaining region of the material layer of the pixel definition layer; and the pattern side surface of the formed pixel definition layer has the delicate slope, which can reduce the slope angle of the pattern of the pixel definition layer. As shown in FIG. 6, after developing the material layer 61 of the pixel definition layer, the slope angle β of the pattern of the formed pixel definition layer 6 may reach below 20° such as 14.9°. In this way, it is not easy to form the color deviation, and the encapsulation layer is subsequently formed, and when the organic rheological material is printed on the display substrate, the plane flow of the organic rheological material is facilitated, and the reliability of the encapsulation can be ensured, thereby improving the yield of the display device.

In the present embodiment, the pattern of the pixel definition layer 6 includes a lower surface close to the base substrate 1 and an upper surface far from the base substrate 1, and the side surface located between these two surfaces, and the slope angle β of the pattern of the pixel definition layer 6 is an included angle between the side surface and the surface far from the base substrate 1.

Taking a positive and negative photoresist material used by the material layer of the photosensitive pixel definition layer as an example, the shape of the first opaque patterns M1 and the upper surface of the pixel definition layer 6 may be the same, the shape of the first transparent patterns M2 and the pixel opening region defined by the pixel definition layer 6 may be the same, and the shape of the transition structures M3 and the shape of the orthogonal projection of the side surface of the pixel definition layer 6 on the display substrate may be the same.

In the mask plate M for manufacturing the display substrate of the present embodiment, as shown in FIG. 4, the second transparent patterns M32 and the second opaque patterns M31 may both be annular, and the center of the second transparent patterns M32 coincides with the center of the second opaque patterns M31. That is to say, the transition structures M3 are continuous, and the transition structures M3 surround the first transparent patterns M2, so that after the pixel definition layer 6 of the display substrate is manufactured using the mask plate M, the slope angles of all side surfaces of the pixel definition layer 6 are relatively small.

In the mask plate M for manufacturing the display substrate of the present embodiment, the first opaque patterns M1 surround the first transparent patterns M2; in the plurality of edges of the first opaque patterns M1, the transition structures M3 may be arranged between each edge and the first opaque patterns M1, or the transition structures M3 may be arranged between part of the edges and the first opaque patterns M1, namely, the transition structures M3 are discontinuous; when the transition structures M3 are a discontinuous structure, after the pixel definition layer 6 of the display substrate is manufactured using the mask plate M, the region of the transition structures M3 is arranged; and the slope angle of the side surface of the pixel definition layer formed is relatively small, and the region where the transition structures M3 are not provided, and the slope angle of the side surface of the resultant pixel definition layer is relatively large, namely, the side surfaces of the pixel definition layers in different regions have different slope angles, so that when the luminescent material ink is ink-jet printed on the display substrate, in the region where the slope angle of the side surface of the pixel definition layer is relatively low, the luminescent material ink is relatively easy to realize plane flow, and in the region where the slope angle of the side surface of the pixel definition layer is relatively high, the luminescent material ink is not easy to realize plane flow, so that the level-off direction of the luminescent material ink can be controlled.

In a specific example, in the mask plate M for manufacturing the display substrate of the present embodiment, as shown in FIG. 7, the first opaque patterns M1 surround the first transparent patterns M2, the first transparent patterns M2 are rectangular, and include the first edge B1, the second edge B2, the third edge B3, and the fourth edge B4 which are successively connected end-to-end in sequence, wherein the transition structures M3 between the second edge B2 and the fourth edge B4 and the first opaque patterns M1 are all opaque patterns. The transition structures M3 between the second edge B2 and the fourth edge B4 and the first opaque patterns M1 may also both be transparent patterns.

In this way, after the pixel definition layer of the display substrate is manufactured by using the mask plate M shown in FIG. 7, the side surface of the pixel definition layer extending in the direction perpendicular to the CC' direction has the relatively small slope angle, and the side surface of the pixel definition layer extending in the direction perpendicular to the BB' direction has the relatively large slope angle, so that after the luminescent material ink is ink-jet printed on the display substrate, the luminescent material ink is relatively easy to realize plane flow in the CC' direction.

The pixel opening region formed by using the mask plate shown in FIG. 7 has the rectangular shape. However, the pixel opening region of the display substrate formed by the present embodiment is not limited to the rectangular shape, but may have other shapes, and FIG. 7 is merely illustrative. For example, the pixel opening region formed using the mask plate shown in FIG. 8 has a diamond shape.

In some display substrates, sub-pixels of the same color are located in the same column, and the luminescent material ink for ink-jet printing should be relatively easy to realize plane flow in the column direction, so that the luminescent material ink for ink-jet printing can be prevented from overflowing to an adjacent column, resulting in pixel crosstalk. Further, in order to make the luminescent material ink jet printed easily plane flow in the column direction, the mask plate M can be designed, for example, the transition structures M3 with an extension direction perpendicular to the column direction are provided on the mask plate M, but no transition structure M3 with an extension direction perpendicular to the row direction is provided on the mask plate M, so that after the pixel definition layer of the display substrate is manufactured using the mask plate M, the side surface of the pixel definition layer with the extension direction perpendicular to the column direction has the smaller slope angle, and the side surface of the pixel definition layer with the extension direction perpendicular to the row direction has the larger slope angle. The ink jet printed luminescent material ink can be made to plane flow relatively easy in the column direction.

In some display substrates, the sub-pixels of the same color are located in the same row, and the luminescent material ink for ink-jet printing should realize plane flow relatively easily in the row direction, so that the luminescent material ink for ink-jet printing can be prevented from overflowing to an adjacent row, resulting in color stringing of pixels; in order to make the luminescent material ink jet printed easily plane flow in the row direction, the mask plate M can be designed, for example, a transition structures M3 with an extension direction perpendicular to the row direction is provided on the mask plate M, while the transition structures M3 with an extension direction perpendicular to the column direction is not provided on the mask plate M, so that after the pixel definition layer of the display substrate is manufactured using the mask plate M, the side surface of the pixel definition layer with an extension direction perpendicular to the row direction has a smaller slope angle, and the side surface of the pixel definition layer with an extension direction perpendicular to the column direction has a larger slope angle. The inkjet printed luminescent material inks can be made to plane flow relatively easy in the row direction.

In some embodiments of the present disclosure, the transition structures include the first transition structures and the second transition structures, the first transparent patterns surround the first opaque patterns, the first opaque patterns have the rectangular shape, and include a first edge, a second edge, a third edge, and a fourth edge which are successively connected end-to-end in sequence, wherein the first transition structures are respectively arranged between the first edge and the third edge and the first transparent patterns, and the second transition structures are respectively arranged between the second edge and the fourth edge and the first transparent patterns. The first transition structures and the second transition structures satisfy any of the following:

the number of the second transparent patterns included in the first transition structures is different from the number of the second transparent patterns included in the second transition structures;

the number of the second opaque patterns included in the first transition structures is different from the number of the second opaque patterns included in the second transition structures;

the line width of the second transparent patterns included in the first transition structures is different from the line width of the second transparent patterns included in the second transition structures; and the line width of the second opaque patterns included in the first transition structures is different from the line width of the second opaque patterns included in the second transition structures.

Specifically the larger the line width of the second transparent patterns is, the more light is transmitted, and the smaller the slope angle is. And the greater the line width of the second opaque patterns is, the less light is transmitted, and the greater the slope angle is. And the larger the number of the second transparent patterns and the second light opaque patterns, the smaller the slope angle.

In this way, by adjusting the line width of the second opaque patterns, the line width of the second transparent patterns, the number of the second opaque patterns, and the number of the second transparent patterns included in the first transition structures and the second transition structures, the slope angle of the side surface of the pixel definition layer of the display substrate can be adjusted to obtain the pixel definition layer satisfying the requirements.

For large-size display products, the pixel definition layer of the display substrate defines the pixel opening region that exposes at least two anode patterns whose orthogonal projections on the display substrate do not overlap.

For small-size display products, in order to ensure that the pixel density of the display product and the region of the pixel opening region of the display substrate is different, when evaporating or ink-jet printing the material into the pixel opening region, in order to satisfy the manufacturing deviation, the position and parameters of the transition structures in the mask plate can be designed, so that in the manufactured display substrate, the pixel opening region with the large region has the larger slope angle, and the pixel opening region with the small region has the smaller slope angle, thereby satisfying the requirements of the manufacturing deviation.

In the above-mentioned embodiments, when the mask plate is used to make the pixel definition layer of the display substrate, the mask plate is parallel to the display substrate, and the row direction of the mask plate is consistent with the row direction of the display substrate; and the column direction of the mask plate coincides with the column direction of the display substrate.

Of course, the material layer of the photosensitive pixel definition layer can also use a negative photoresist material, and when the material layer of the photosensitive pixel definition layer uses the negative photoresist material, the method includes:

forming the photosensitive material layer of the pixel definition layer on the driving substrate, exposing the material layer of the pixel definition layer by using the above-mentioned mask plate, and forming the pattern of the pixel definition layer after developing, wherein the first transparent patterns M2 of the mask plate corresponds to an upper surface of the pixel definition layer, the first opaque patterns M1 correspond to the pixel opening region defined by the pixel definition layer, and the transition structures M3 correspond to the side surface of the pixel definition layer.

The embodiments of the present disclosure also provide the display substrate manufactured by using the manufacturing method of the display substrate as described above, wherein the slope angle of the pattern of the pixel definition layer of the display substrate is less than 20°.

As shown in FIG. 6, the display substrate of the present embodiment includes the pixel definition layer 6 located on the driving substrate, wherein the driving substrate includes the base substrate 1, the buffer layer 2 located on the base substrate 1, the active layer 7, the gate insulating layer 3, the gate electrode 8, the interlayer insulating layer 4, the source electrode 9, the drain electrode 10, the passivation layer and the planarization layer 5, and the anode 11, etc.

In the display substrate of the present embodiment, the slope angle β of the pixel definition layer 6 is relatively small, so that the color deviation is not easy to form, and the encapsulation layer is subsequently formed, and when the organic rheological material is printed on the display substrate, the organic rheological material is easy to realize plane flow, so that the reliability of encapsulation can be ensured, and the yield of the display device can be improved.

In some embodiments, if the material layer of the photosensitive pixel definition layer uses the positive photoresist material, the first opaque patterns M1 correspond to the upper surface of the pixel definition layer, the first transparent patterns M2 correspond to the pixel opening region defined by the pixel definition layer, and the transition structures M3 correspond to the side surface of the pixel definition layer; the first opaque patterns M1 have the same shape as the upper surface of the pixel definition layer, and the first transparent patterns M2 have the same shape as the pixel opening region defined by the pixel definition layer; and the shape of the transition structures M3 is the same as the shape of the orthographic projection of the side surface of the pixel definition layer on the display substrate.

In the mask plate M for manufacturing the display substrate of the present embodiment, as shown in FIG. 4, the second transparent patterns M32 and the second opaque patterns M31 may both be annular, and the center of the second transparent patterns M32 coincides with the center of the second opaque patterns M31. That is to say, the transition structures M3 are continuous, and the transition structures M3 surround the first transparent patterns M2, so that after the pixel definition layer 6 of the display substrate is manufactured using the mask plate M, the slope angles of all side surfaces of the pixel definition layer 6 are relatively small.

In the mask plate M for manufacturing the display substrate of the present embodiment, the first opaque patterns M1 surround the first transparent patterns M2; in the plurality of edges of the first opaque patterns M1, the transition structures M3 may be arranged between each edge and the first opaque patterns M1, or the transition structures M3 may be arranged between part of the edges and the first opaque patterns M1, namely, the transition structures M3 are discontinuous. When the transition structures M3 are a discontinuous structure, after the pixel definition layer 6 of the display substrate is manufactured using the mask plate M, the region of the transition structures M3 is arranged; and the slope angle of the side surface of the pixel definition layer formed is relatively small, and the region where the transition structures M3 are not provided, and the slope angle of the side surface of the pixel definition layer formed is relatively large, namely, the side surfaces of the pixel definition layers in different regions have different slope angles, so that when the luminescent material ink is ink-jet printed on the display substrate, in the region where the slope angle of the side surface of the pixel definition layer is relatively low, the luminescent material ink is relatively easy to realize plane flow, and in the region where the slope angle of the side surface of the pixel definition layer is relatively high, the luminescent material ink is not easy to realize plane flow, so that the plane flow direction of the luminescent material ink can be controlled.

In a specific example, as shown in FIG. 7, the first opaque patterns M1 surround the first transparent patterns M2, the first transparent patterns M2 are rectangular, and include a first edge B1, a second edge B2, a third edge B3, and a fourth edge B4 which are successively connected end-to-end in sequence, wherein the transition structures M3 between the second edge B2 and the fourth edge B4 and the first opaque patterns M1 are all opaque patterns. The transition structures M3 between the second edge B2 and the fourth edge B4 and the first opaque patterns M1 may also both be transparent patterns.

In this way, after the pixel definition layer of the display substrate is manufactured by using the mask plate M shown in FIG. 7, the pixel opening region defined by the pixel definition layer is rectangular, and the pattern of the pixel definition layer includes the first side surface, the second side surface, the third side surface, and the fourth side surface which surround the pixel opening region and are successively connected end-to-end in sequence, the extension direction of the first side surface is perpendicular to the BB' direction, the extension direction of the second side surface is perpendicular to the CC' direction, the slope angle of the first side surface is the same as that of the third side surface, and the slope angle of the second side surface is the same as that of the fourth side surface; and the slope angle of the first side surface is larger than the slope angle of the second side surface. After ink-jet printing the luminescent ink on the display substrate in this way, the luminescent ink is relatively easy to realize plane flow in the CC' direction.

The pixel opening region formed by using the mask plate shown in FIG. 7 has the rectangular shape. However, the pixel opening region of the display substrate formed by the present embodiment is not limited to the rectangular shape, but may have other shapes, and FIG. 7 is merely illustrative. For example, the pixel opening region formed using the mask plate shown in FIG. 8 has a diamond shape.

In some display substrates, sub-pixels of the same color are located in the same column, and the luminescent material ink for ink-jet printing should be relatively easy to realize plane flow in the column direction, so that the luminescent material ink for ink-jet printing can be prevented from overflowing to an adjacent column, resulting in pixel crosstalk; in order to make the luminescent material ink jet printed easily plane flow in the column direction, the mask plate M can be designed, for example, the transition structures M3 with an extension direction perpendicular to the column direction are provided on the mask plate M, but no transition structure M3 with an extension direction perpendicular to the row direction is provided on the mask plate M, so that after the pixel definition layer of the display substrate is manufactured by using the mask plate M, the side surface of the pixel definition layer of the display substrate with the extension direction perpendicular to the column direction has the smaller slope angle, and the side surface of the pixel definition layer of the display substrate with the extension direction perpendicular to the row direction has the larger slope angle. The ink jet printed luminescent material ink can be made to realize plane flow relatively easy in the column direction.

In some display substrates, the sub-pixels of the same color are located in the same row, and the luminescent material ink for ink-jet printing should plane flow relatively easily in the row direction, so that the luminescent material ink for ink-jet printing can be prevented from overflowing to an adjacent row, resulting in crosstalk of pixels; in order to make the luminescent material ink jet printed easily plane flow in the row direction, the mask plate M can be designed, for example, the transition structures M3 with an extension direction perpendicular to the row direction is provided on the mask plate M, while the transition structures M3 with an extension direction perpendicular to the column direction is not provided on the mask plate M, so that after the pixel definition layer of the display substrate is manufactured by using the mask plate M, the side surface of the pixel definition layer of the display substrate with an extension direction perpendicular to the row direction has a smaller slope angle, and the side surface of the pixel definition layer of the display substrate with an extension direction perpendicular to the column direction has a larger slope angle. The inkjet printed luminescent material inks can be made to realize plane flow relatively easy in the row direction.

In some embodiments of the present disclosure, the transition structures include the first transition structures and the second transition structures, the first transparent patterns surround the first opaque patterns, the first opaque patterns have the rectangular shape, and include a first edge, a second edge, a third edge, and a fourth edge which are successively connected end-to-end in sequence, wherein the first transition structures are respectively arranged between the first edge and the third edge and the first transparent patterns, and the second transition structures are respectively arranged between the second edge and the fourth edge and the first transparent patterns. The first transition structures and the second transition structures satisfy any of the following:

- the number of the second transparent patterns included in the first transition structures is different from the number of the second transparent patterns included in the second transition structures;
- the number of the second opaque patterns included in the first transition structures is different from the number of the second opaque patterns included in the second transition structures;
- the line width of the second transparent patterns included in the first transition structures is different from the line width of the second transparent patterns included in the second transition structures; and
- the line width of the second opaque patterns included in the first transition structures is different from the line width of the second opaque patterns included in the second transition structures.

Specifically the larger the line width of the second transparent patterns is, the more light is transmitted, and the smaller the slope angle is. And the greater the line width of the second opaque patterns is, the less light is transmitted, and the greater the slope angle is. Further the larger the number of the second transparent patterns and the second light opaque patterns, the smaller the slope angle.

In this way, by adjusting the line width of the second opaque patterns, the line width of the second transparent patterns, the number of the second opaque patterns, and the number of the second transparent patterns included in the first transition structures and the second transition structures, the slope angle of the side surface of the pixel definition layer of the display substrate can be adjusted to obtain the pixel definition layer satisfying the requirements.

For large-size display products, the pixel definition layer of the display substrate defines the pixel opening region that exposes at least two anode patterns whose orthogonal projections on the display substrate do not overlap.

For small-size display products, in order to ensure that the pixel density of the display product and the region of the pixel opening region of the display substrate is different, when evaporating or ink-jet printing the material into the pixel opening region, in order to satisfy the manufacturing deviation, the position and parameters of the transition structures in the mask plate can be designed, so that in the manufactured display substrate, the pixel opening region with the large region has the larger slope angle, and the pixel opening region with the small region has the smaller slope angle, thereby satisfying the requirements of the manufacturing deviation.

In the above-mentioned embodiments, the row direction of the mask plate coincides with the row direction of the display substrate; the column direction of the mask plate coincides with the column direction of the display substrate.

In some embodiments, when the transition structures M3 are annular, the contour shape of the transition structures M3 may be substantially the same as the shape of the first transparent patterns M2. As shown in FIG. 8, the contour shape of the transition structures M3 may also be different from the shape of the first transparent patterns M2. The pixel opening region defined by the pixel definition layer may have the same shape as that of the first transparent patterns M2. Alternatively, the shape of the pixel opening region is the same as the shape defined by the shape of the transition structures M3.

The above-mentioned embodiment describes that the photosensitive material layer of the pixel definition layer uses the positive photoresist material; certainly, the photosensitive pixel definition layer material layer is not limited to use positive photoresist material and can also use the negative photoresist material; when the photosensitive material layer of the pixel definition layer uses the negative photoresist material, the first transparent patterns M2 correspond to the upper surface of the pixel definition layer, the first opaque patterns M1 correspond to the pixel opening region defined by the pixel definition layer, and the transition structures M3 correspond to the side surface of the pixel definition layer; and the shape of the first transparent patterns M2 is the same as that of the upper surface of the pixel definition layer. The first opaque patterns M1 are the same as the pixel opening region defined by the pixel definition layer, and the shape of the transition structures M3 is the same as the shape of the orthogonal projection of the side surface of the pixel definition layer on the display substrate.

The embodiments of the present disclosure also provide the display device including the display substrate as described above.

The display device includes, but is not limited to: a radio frequency unit, a network module, an audio output unit, an input unit, a sensor, a display unit, a user input unit, an interface unit, a memory, a processor, and a power supply, etc. Those skilled in the art should know that the configuration of the display device described above is not to be construed as limiting the display device, and that the display device can include more or fewer of the components described above, or some combinations of the components, or different arrangements of the components. In embodiments of the present disclosure, the display devices include, but are not limited to, displays, cell phones, tablets, televisions, wearable electronics, navigation display devices, and the like.

The display device can be: any product or component with a display function, such as a television, a display, a digital photo frame, a mobile phone, a tablet computer, wherein the display device further includes a flexible circuit board, a printed circuit board, and a back plate.

In the various method in the embodiments of the present disclosure, the sequence number of each step cannot be used to define the order of each step, and for a person of ordinary skill in the art, without involving any inventive effort, it is also within the scope of the present disclosure to change the order of each step.

It should be understood that each of the embodiments described in the specification is intended to be presented in an enabling manner, similar elements can be referenced throughout the various embodiments, and each of the embodiments is intended to cover variations from the other embodiments. Particularly, the system embodiments are similar to product embodiments, and therefore are described briefly. For a related part, references can be made to some descriptions in the product embodiments.

Unless defined otherwise, technical or scientific terms used in the present disclosure should have the ordinary meaning as understood by one of ordinary skill in the art to which the disclosure belongs. The use of "first", "second", and the like in this disclosure do not represent any order, quantity, or importance, but are just to distinguish different components. The word "comprises" or "includes", and the like, mean that the presence of an element or item preceding the word covers the presence of the element or item listed after the word and equivalents thereof, but does not exclude other elements or items. "connect/connected", "mutually connected" or similar words are not limited to physical or mechanical connection but may include electrical connection, either direct or indirect. The terms "upper", "lower", "left", "right" and the like are used only to indicate relative positional relationships that may change accordingly when the absolute position of the object being described changes.

It can be understood that when an element such as a layer, film, area or substrate is referred to as being "upper" or "lower" located on the other element, it can be "directly upper" or "lower" located on the other element or intervening elements may be present.

In the description of the embodiments above, particular features, structures, materials, or characteristics can be combined in any suitable manner in any one or more embodiments or examples.

The above embodiments are merely specific implementation modes of the present disclosure, but the scope of protection of the present disclosure is not limited thereto, and any modification and substitution be apparent to those skilled in the art without departing from the technical scope of the present disclosure shall covered by the scope protection of the present disclosure. Therefore, the scope of protection of the disclosure shall be subject to the scope of protection of the claims.

What is claimed is:

1. A mask plate, wherein the mask plate is used for manufacturing a pixel definition layer of a display substrate, which comprises first transparent patterns and first opaque patterns, and further comprises transition structures located between the first transparent patterns and the first opaque patterns, wherein the transition structures include a plurality of second transparent patterns and second opaque patterns alternately arranged, and a line width of each of the second transparent patterns and each of the second opaque patterns is less than a resolution of an exposure machine by using the mask plate for exposure;

wherein the transition structures include a second transition structure, the first opaque patterns surround the first transparent patterns, the first transparent patterns have a rectangular shape, and include the first edge, the second edge, the third edge, and the fourth edge which are successively connected end-to-end in sequence, wherein the second transition structures are respectively arranged between the second edge and the fourth edge and the first opaque patterns, and the transition structures are not arranged between the first edge and the third edge and the first opaque patterns.

2. The mask plate according to claim 1, wherein the first opaque patterns have the same shape as an upper surface of the pixel definition layer, the first transparent patterns have the same shape as a pixel opening region defined by the pixel definition layer, and the transition structures have the same shape as an orthographic projection of the side surface of the pixel definition layer on the display substrate.

3. The mask plate according to claim 2, wherein the line width of the second transparent patterns gradually increases from the first opaque patterns to the first transparent patterns.

4. The mask plate according to claim 1, wherein the first transparent patterns have the same shape as the upper surface of the pixel definition layer, the first opaque patterns have the same shape as the pixel opening region defined by the pixel definition layer, and the transition structures have the same shape as the orthographic projection of the side surface of the pixel definition layer on the display substrate.

5. The mask plate according to claim 1, wherein the first opaque patterns surround the first transparent patterns, and the transition structures between part of the edges and the first opaque patterns in the plurality of edges of the first transparent patterns are the second opaque patterns or the second transparent patterns.

6. The mask plate according to claim 5, wherein the first opaque patterns surround the first transparent patterns, the first transparent patterns have a rectangular shape and include a first edge, a second edge, a third edge, and a fourth edge which are connected end-to-end in sequence, wherein the transition structures between the second edge and the fourth edge and the first opaque patterns are the opaque patterns or the transparent patterns.

7. The mask plate according to claim 1, wherein the transition structures include a number of three to five second transparent patterns and a number of three to five second opaque patterns.

8. The mask plate according to claim 1, wherein a line width of each of the second transparent patterns and each of the second opaque patterns is less than 2.5 μm.

9. A method for manufacturing a display substrate, comprising:
forming a material layer of a photosensitive pixel definition layer on a driving substrate;
exposing the material layer of the pixel definition layer by using the mask plate as claimed in claim 1, and
forming the pattern of the pixel definition layer after developing.

10. A display substrate, wherein a pixel definition layer of the display substrate is obtained by patterning a material layer of the pixel definition layer using the mask plate as claimed in claim 1.

11. The display substrate according to claim 10, wherein a slope angle of the pattern of the pixel definition layer is less than 20°.

12. The display substrate according to claim 10, wherein the pixel definition layer of the display substrate defines a pixel opening region.

13. The display substrate according to claim 10, wherein the pixel opening region has a rectangular shape, and the pattern of the pixel definition layer comprises a first side surface, a second side surface, a third side surface, and a fourth side surface surrounding the pixel opening region and are successively connected end-to-end in sequence, wherein the first side surface has the same slope angle as the third side surface, the second side surface has the same slope angle as the fourth side surface, and the first side surface has a greater slope angle than the second side surface.

14. The display substrate according to claim 10, wherein the pixel opening region has the same shape as the first transparent patterns; or
the shape of the pixel opening region is the same as the shape defined by the contours of the transition structures.

15. A display device, comprising the display substrate as claimed in claim 10.

* * * * *